United States Patent
Wang et al.

(10) Patent No.: US 7,482,884 B2
(45) Date of Patent: Jan. 27, 2009

(54) RING OSCILLATOR WITH A TWO-STAGE PHASE BLENDER FOR GENERATING MULTI-PHASE CLOCK SIGNALS

(75) Inventors: Ming-Hung Wang, Hsinchu (TW); Peng-Fei Lin, Hsinchu (TW); Ming-Chi Lin, Hsinchu (TW)

(73) Assignee: MOAI Electronics Corporation, Hsinchu (TW)

( * ) Notice: Subject to any disclaimer, the term of this patent is extended or adjusted under 35 U.S.C. 154(b) by 147 days.

(21) Appl. No.: 11/669,944

(22) Filed: Jan. 31, 2007

(65) Prior Publication Data

US 2008/0180181 A1 Jul. 31, 2008

(51) Int. Cl.
*H03B 5/24* (2006.01)
*H03B 27/00* (2006.01)
*H03K 3/03* (2006.01)

(52) U.S. Cl. .......................................... 331/45; 331/57
(58) Field of Classification Search ................. 331/1 A, 331/8, 25, 45, 57, 179
See application file for complete search history.

(56) References Cited

U.S. PATENT DOCUMENTS

| 5,592,126 A | 1/1997 | Boudewijns et al. | 331/45 |
| 6,122,336 A | * 9/2000 | Anderson | 375/371 |
| 6,870,431 B2 | 3/2005 | Afghahi | 331/46 |

OTHER PUBLICATIONS

A Portable Digital DLL for High-Speed CMOS Interface Circuits Bruno W. Garlepp, Kevin S. Donnelly, Associate Member, IEEE, Jun Kim, Pak S. Chau, Jared L. Zerbe, Charles Huang, Chanh V. Tran, Clemenz L. Portmann, Member, IEEE, Donald Stark, Yui-Fai Chan, Member, IEEE, Thomas H. Lee, Member, IEEE, and Mark A. Horowitz IEEE Journal of Solid-State Circuits, vol. 34, No. 5, May 1999.

A 1.3-Cycle Lock Time, Non-PLL/DLL Clock Multiplier Based on Direct Clock Cycle Interpolation for "Clock on Demand" Takanori Saeki, Member, IEEE, Masafumi Mitsuishi, Member, IEEE, Hiroaki Iwaki, and Mitsuaki Tagishi IEEE Journal of Solid-State Circuits, vol. 35, No. 11, Nov. 2000.

* cited by examiner

Primary Examiner—David Mis

(57) ABSTRACT

An apparatus for generating multi-phase clock signals with a ring oscillator is provided, including a first stage phase-blender module and a second stage phase-blender module. The first stage phase-blender module further includes a plurality of differential OP phase-blender circuits. Each differential blender circuit has two signal inputs, and an output signal whose phase is an interpolation of the two input signals. The second stage phase blender module includes a plurality of inverter phase-blender circuits. Each inverter phase-blender circuit receives two output signals from the first stage phase-blender module as inputs, and outputs a clock signal with the interpolated phase of the two output signals of the first stage phase-blender module.

4 Claims, 5 Drawing Sheets

Phase Interpolation Circuit

Differential OP

US 7,482,884 B2

RING OSCILLATOR WITH A TWO-STAGE PHASE BLENDER FOR GENERATING MULTI-PHASE CLOCK SIGNALS

FIELD OF THE INVENTION

The present invention generally relates to a high frequency multi-phase ring oscillator, and more specifically to a novel design and method for constructing a high frequency multi-phase oscillator through the interpolation of non-full swing signals.

BACKGROUND OF THE INVENTION

The multi-phase oscillator plays an important role in many data communication applications. There are many proposed methods of implementing a multi-phase oscillator. For example, a ring oscillator is an oscillator containing an odd-number of inverters in cascade. Because of the odd-numbered cascade stages, the outputs of the inverters will oscillate between high and low. However, a conventional ring oscillator suffers from the disadvantages that only odd-number of multi-phase signals can be generated with this structure. Another disadvantage is that the maximum attainable frequency decreases as the number of the stages of inverters used in the ring decrease.

U.S. Pat. No. 5,592,126 disclosed a multi-phase output oscillator, including a number of serially coupled oscillators organized in a loop, with each oscillator further including a plurality of interconnected invertors. The disclosed structure can generate an even-number of multi-phase signals. U.S. Pat. No. 6,870,431 disclosed an oscillator having multi-phase complementary outputs, including a first plurality of single-ended amplifiers connected in series to form an input and an output, and a second plurality of single-ended amplifiers connected in series to form an input and an output. The two pluralities of cascade amplifiers are further interconnected with feedback paths and locking circuit to generate multi-phase complimentary signals.

Another widely used method to generate multi-phase clock signals is to use interpolation, also called phase-blending, of a plurality of input signals. FIG. 1 shows a schematic view of a conventional single-stage phase-blender circuit with input signal $\Phi_A$, $\Phi_B$ and output signals $\Phi_A$, $\Phi_B$, $\Phi_{AB}$, where $\Phi_{AB}$ is a signal generated by the interpolation of signals $\Phi_A$, $\Phi_B$. For example, IEEE Journal of Solid-State Circuits, vol. 34, No. 5 (May 1999) disclosed a portable digital DLL for high speed CMOS interface circuits. However, this interpolation approach usually has the disadvantage of imprecise interpolated signal in terms of phase. This is because the input signals are full swing signals, from which a signal with precise phase between the two input signals is difficult to obtain.

One common approach to overcoming the above imprecise phase problem is to increase the loading at the input, such as by adding capacitors, so that the input signals become non-full swing signals. This will improve the phase precision in the interpolated signals. For example, IEEE Journal of Solid-State Circuits, vol. 35, No. 11 (November 2000) disclosed a 1.3-cycle lock time, non-PLL/DLL clock multiplier based on direct clock cycle interpolation for "clock on demand". However, this approach has the disadvantage of unstable and shifting electrical characteristic due to the addition of capacitors in the manufacturing process.

It is imperative to provide a multi-phase oscillator that is easy to manufacture, and yet able to provide precise and stable phase interpolation to generate multi-phase signals for various data communication applications.

SUMMARY OF THE INVENTION

The present invention has been made to overcome the aforementioned drawback of a conventional multi-phase oscillator. The primary object of the present invention is to provide a design and method for generating multi-phase clock signals with a ring oscillator whose phase precision can be easily controlled.

Another object of the present invention is to provide a design and method for generating multi-phase clock signals with a ring oscillator that does not use capacitors as additional loading to obtain the non-full swing signal. Without the use of additional capacitors as loading, the present invention prevents the manufacturing process from affecting the electronic characteristic stability of the ring oscillator.

To achieve the above objects, the present invention provides a design for generating multi-phase clock signals with a ring oscillator, including a first stage phase-blender module and a second stage phase-blender module. The first stage phase-blender module further includes a plurality of differential OP phase-blender circuits. Each differential OP phase-blender circuit has two signal inputs, and an output signal whose phase is an interpolation of the two input signals. The second stage phase blender module includes a plurality of inverter phase-blender circuits. Each inverter phase-blender circuit receives two output signals from the first stage phase-blender module as inputs, and outputs a clock signal with the interpolated phase of the two output signals of the first stage phase-blender module. The present invention also provides a method for generating multi-phase clock signals with a ring oscillator, including the following steps: (1) using a ring oscillator to provide at least two non-full swing signals, (2) using a differential OP phase-blender circuit to blend the phases of two non-full signals from the ring oscillator, and (3) using an inverter phase-blender circuit to generate a clock signal with interpolated phase.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1:
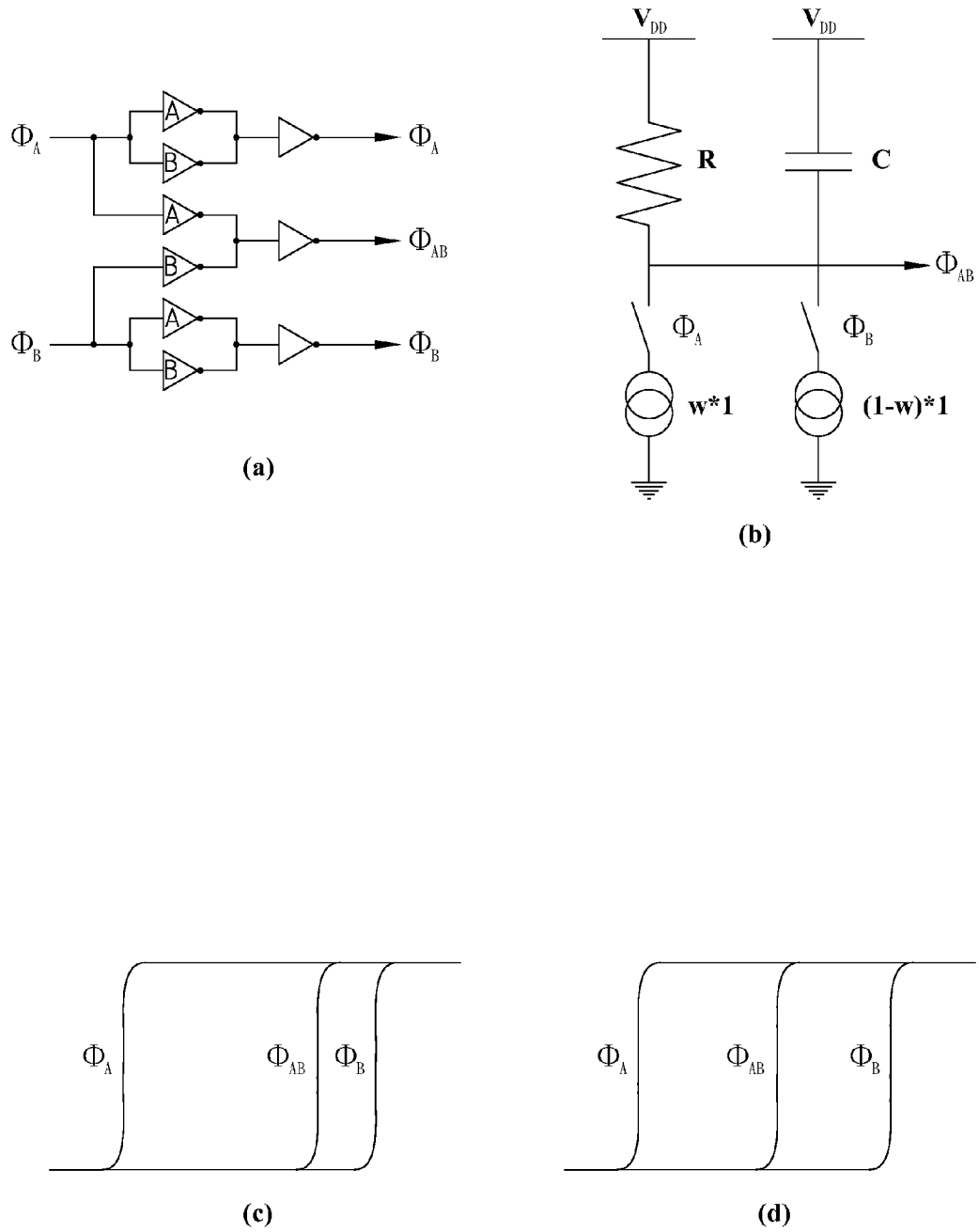
FIG. 1 shows a schematic view of a conventional single-stage phase-blender circuit.
Figure 2:
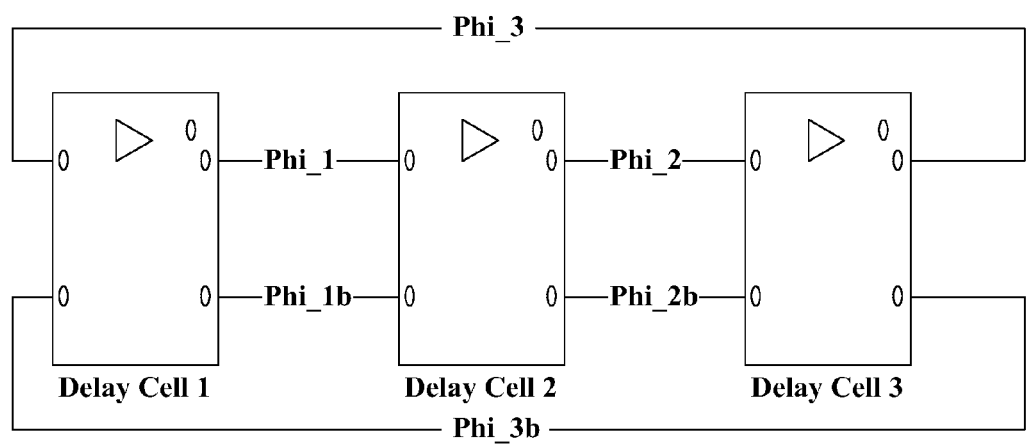
FIG. 2 shows the first embodiment of a ring oscillator generating three-phase signals applied in the present invention.

FIG. 2 shows the first embodiment of a ring oscillator generating three-phase signals applied in the present invention. As shown in FIG. 2, the three-phase ring oscillator includes three delay cells connected in cascade to generate the signals Phi_1, Phi_1b, Phi2, Phi_2b, Phi_3, Phi_3b, where Phi_1b, Phi_2b, and Phi_3b have the opposite phase of Phi_1, Phi_2 and Phi_3, respectively. The signals Phi_1, Phi_1b, Phi2, Phi_2b, Phi_3, Phi_3b are non-full swing signals.

Figure 3:
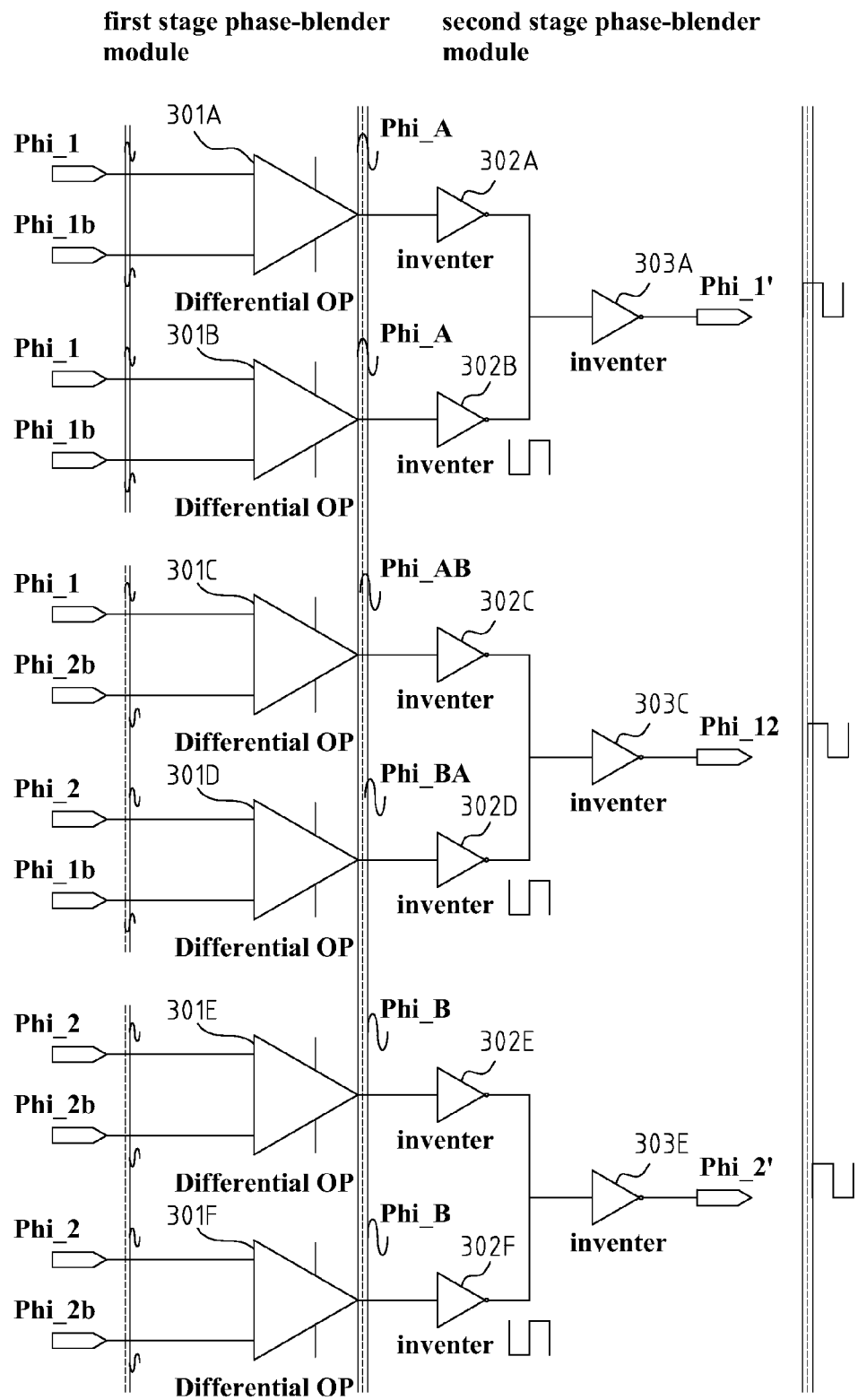
FIG. 3 shows an embodiment of a two-staged phase blender for two signals with different phases of the present invention.

FIG. 3 shows an embodiment of a two-staged phase blender for two signals with different phases of the present invention. As shown in FIG. 3, the embodiment is used to generate three-phase clock signals for two non-full swing signals Phi_1, Phi_2 and their complements Phi_1b, Phi_2b. The two-staged phase-blender of the present invention includes a first stage phase-blender module, and a second stage phase-blender module. The first stage includes a plurality of differential OP phase-blender circuits. Each differential OP phase-blender circuit receives two input signals. For example, differential OP phase-blender circuit 301A receives signals Phi_1, Phi_1b as inputs, and differential OP phase-blender circuit 301B also receives signals Phi_1, Phi_1b. Similarly, differential OP phase-blender circuit 301E receives signals Phi_2, Phi_2b, and differential OP phase-blender circuit 301F also receives signals Phi_2, Phi_2b. However, the inputs to differential OP phase-blender circuit 301C are signals Phi_1, Phi_2b, while the inputs to differential OP phase-blender circuit 301D are signals Phi_2, Phi_1b, respectively. The output signals from differential OP phase-blender circuits 301A-301F are marked as signals Phi_A, Phi_A, Phi_AB, Phi_BA, Phi_B, Phi_B, respectively.

It is worth noticing that signal Phi_A is the amplified signal of signal Phi_1. In other words, the phase of signals Phi_A is the same as signal Phi_1, while the amplitude of signal Phi_A is larger than the amplitude of signal Phi_1. Similarly, signal Phi_B is the amplified signal of signal Phi_2. The purpose of differential OP phase-blender circuits 301A, 301B, 301E, 301F is to cause the same delay as to compensate the delay caused by differential OP phase-blender circuits 301C, 301D. Output signal Phi_AB of differential OP phase-blender circuit 301C is a signal with the phase that is interpolation of signals Phi_1, Phi_2b, and output signal Phi_BA of differential OP phase-blender circuit 301D is a signal with the phase that is interpolation of signals Phi_2, Phi_1b.

The second stage phase-blender module includes a plurality of inverter phase-blender circuits. In the present embodiment, each inverter phase-blender circuit includes three inverters. For example, as shown in FIG. 3, inverter 302A, 302B, 303A form an inverter phase-blender circuit to blend signals Phi_A, Phi_A and generate a clock signal Phi_1'. It is worth noticing that clock signal Phi_1' has the phase of signal Phi_A, which is also the same as signal Phi_1. Similarly, clock signal Phi_2' has the phase of signal Phi_B which is the same as signal Phi_2. On the other hand, inverters 302C, 302D, 303C form an inverter phase-blender circuit to blend signals Phi_AB, Phi_BA and generate a clock signal Phi_12 whose phase is an interpolation of the signals Phi_1 and Phi_2. Therefore, the embodiment of the two-staged phase-blender blends two signals Phi_1, Phi_2, and generates three-phase clock signals Phi_1', Phi_12, Phi_2'.

Similarly, a two-staged phase-blender can be constructed to blend two signals Phi_2, Phi_3, and generate three-phase clock signals Phi_2', Phi_23, Phi_3', and a two-staged phase-blender can be constructed to blend two signals Phi_3, Phi_1, and generate three-phase clock signals Phi_3', Phi_31, Phi_1', respectively.

Figure 4:
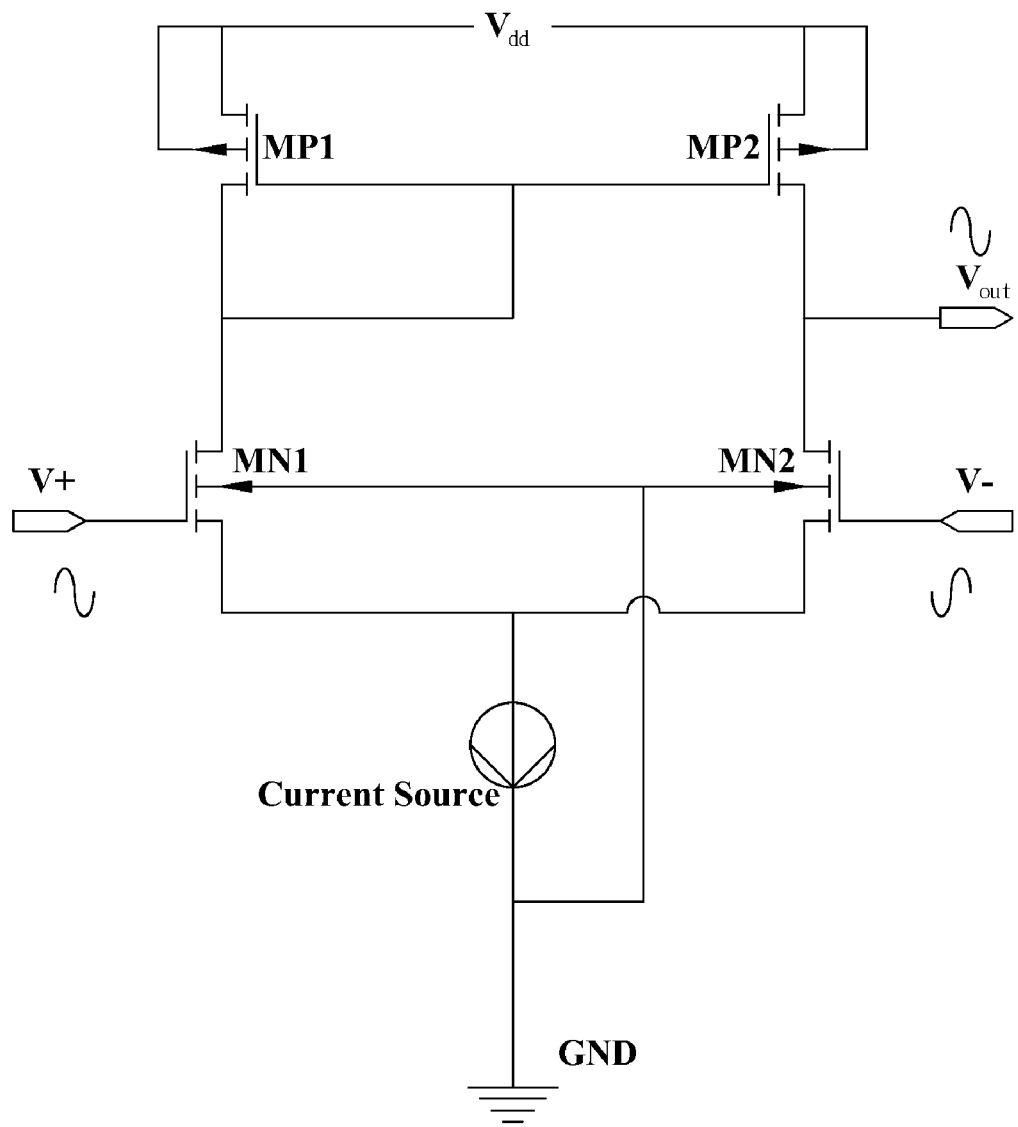
FIG. 4 shows a schematic view of the differential OP phase-blender circuit of the present invention.

FIG. 4 shows a detailed differential OP phase-blender circuit with inputs V+, V−, and an output Vout signal. Using differential OP phase-blender circuit 301C of FIG. 3 as example, because signal Phi_2b (V−) has a phase delay in comparison with signal Phi_1 (V+), transistor MN2 is delayed in turning down the current. Thus, output signal Phi_AB (Vout) has a phase delay in comparison with signal Phi_A, which is the output signal of differential OP phase-blender circuits 301A, 301B. Similarly, with differential OP phase-blender circuit 301D of FIG. 3, because signal Phi_2 (V+) has a phase delay in comparison with signal Phi_1b (V−), transistor MN2 turns down the current prior to MN1. Thus, output signal Phi_BA (Vout) has a phase delay in comparison with signal Phi_B, which is the output signal of differential OP phase-blender circuits 301E, 301F. Signal Phi_AB and signal Phi_BA are then blended again with the inverters 302C, 302D, 303C to obtain clock signal Phi_12. It is worth noticing that the inverter phase-blender circuit formed by 302A, 302B 303A and the inverter phase-blender formed by 302E, 302F, 303E are both also compensating for the delay.

Figure 5:
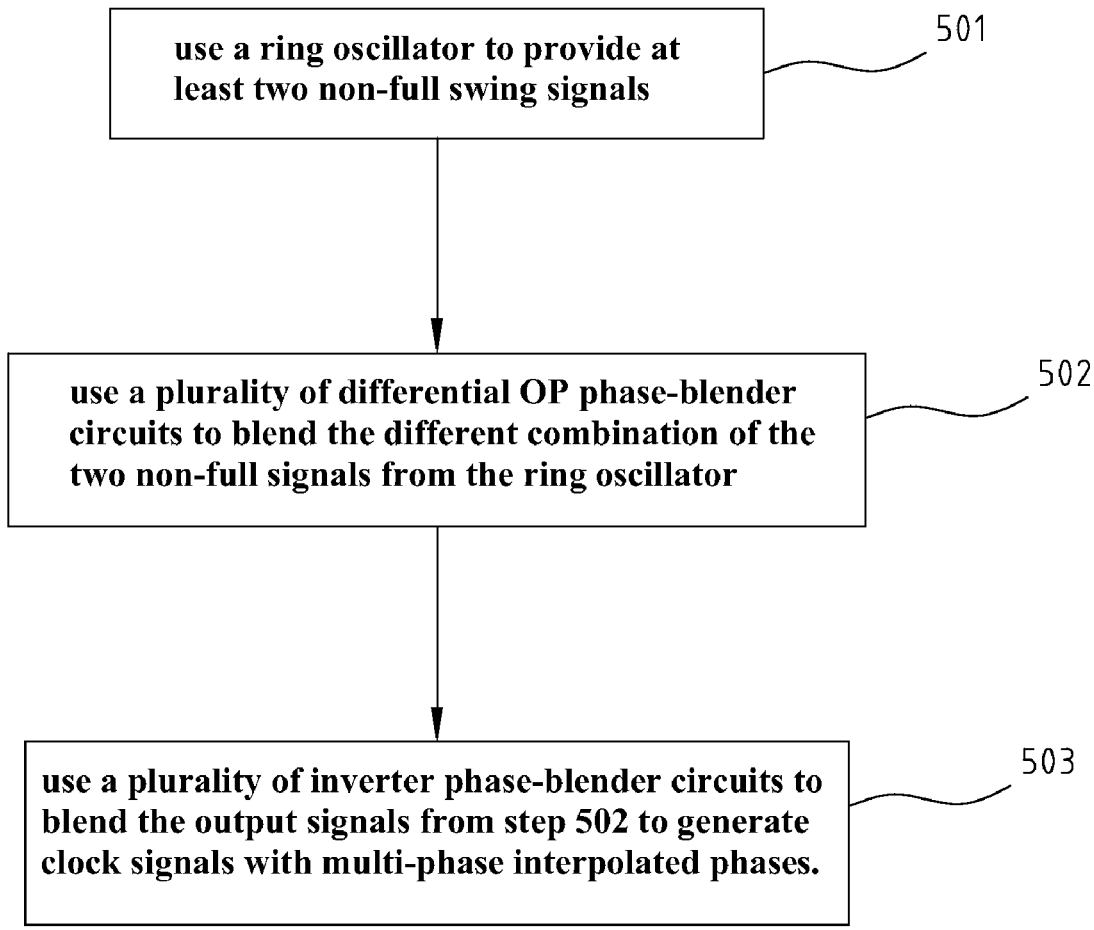
FIG. 5 shows a flowchart of a method of generating multi-phase clock signals with a ring oscillator of the present invention.

FIG. 5 shows a flowchart of a method of generating multi-phase clock signals with a ring oscillator. As shown in FIG. 5, step 501 is to use a ring oscillator to provide at least two non-full swing signals. Step 502 is to use a plurality of differential OP phase-blender circuits to blend the different combination of the two non-full signals from the ring oscillator. Finally, step 503 is to use a plurality of inverter phase-blender circuits to blend the output signals from step 502 to generate multi-phase clock signals with interpolated phases.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An apparatus for generating multi-phase clock signals with a ring oscillator, comprising:
   a first stage phase-blender module, for receiving at least two different-phased signals from said ring oscillator and outputting a plurality of signals with different phases; and
   a second stage phase-blender module, connected to said first stage phase-blender module, for receiving said plurality of signals with different phases from said first stage phase-blender module and generating said multi-phase clock signals;
   wherein said second stage phase-blender module further comprises a plurality of inverter phase-blender circuits.

2. The apparatus as claimed in claim 1, wherein said first stage phase-blender module further comprises a plurality of differential OP phase-blender circuits.

3. The apparatus as claimed in claim 1, wherein each of said plurality of inverter phase-blender circuits comprises a first inverter to receive a first signal and generate a first inverted signal, a second inverter to receive a second signal and generate a second inverted signal, and a third inverter to receive a joint signal of said first inverted signal and said second inverted signal and generate said multi-phase clock signals having interpolated phases of said first signal and said second signal.

4. A method for generating multi-phase clock signals with a ring oscillator, comprising the following steps of:
   (a) using a ring oscillator to provide at least two non-full swing signals;
   (b) using a plurality of differential OP phase-blender circuits to blend the phases of said at least two non-full swing signals from said ring oscillator; and
   (c) using a plurality of inverter phase-blender circuits to blend the blended signals of said step (b) to generate said multi-phase clock signals with interpolated phases.

* * * * *